(12) United States Patent
Lee et al.

(10) Patent No.: US 7,037,850 B2
(45) Date of Patent: May 2, 2006

(54) METHOD FOR FABRICATING SEMICONDUCTOR DEVICE WITH FINE PATTERNS

(75) Inventors: Sung-Kwon Lee, Ichon-shi (KR); Sang-Ik Kim, Ichon-shi (KR); Min-Suk Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/728,775

(22) Filed: Dec. 8, 2003

(65) Prior Publication Data

US 2004/0198065 A1 Oct. 7, 2004

(30) Foreign Application Priority Data

Apr. 4, 2003 (KR) .................... 10-2003-0021291

(51) Int. Cl.
*H01L 21/302* (2006.01)
*H01L 21/461* (2006.01)

(52) U.S. Cl. .................. 438/725; 438/706; 438/710; 438/717

(58) Field of Classification Search ............... 438/585, 438/706–712, 717–725
See application file for complete search history.

(56) References Cited

U.S. PATENT DOCUMENTS

| | | | |
|---|---|---|---|
| 5,219,793 A | | 6/1993 | Cooper et al. |
| 6,171,940 B1 * | | 1/2001 | Huang ........................ 438/585 |
| 6,200,907 B1 | | 3/2001 | Wang et al. |
| 6,283,131 B1 | | 9/2001 | Chen et al. |
| 6,329,695 B1 | | 12/2001 | Duane et al. |
| 6,440,870 B1 * | | 8/2002 | Nallan et al. ................ 438/734 |
| 6,482,726 B1 * | | 11/2002 | Aminpur et al. ............ 438/585 |
| 6,576,562 B1 * | | 6/2003 | Ohuchi et al. .............. 438/725 |
| 6,682,996 B1 * | | 1/2004 | Blosse ......................... 438/586 |
| 6,764,903 B1 * | | 7/2004 | Chan et al. .................. 438/257 |
| 2004/0129361 A1 * | | 7/2004 | Chen et al. ................... 156/58 |

FOREIGN PATENT DOCUMENTS

KR    1020000025529    5/2000

* cited by examiner

*Primary Examiner*—Thanh Nguyen
(74) *Attorney, Agent, or Firm*—Mayer, Brown, Rowe & Maw LLP

(57) ABSTRACT

The present invention relates to a method for fabricating a semiconductor device with realizable advanced fine patterns. The method includes the steps of: forming a hard mask insulation layer on an etch target layer; forming a hard mask sacrificial layer on the hard mask insulation layer; coating a photoresist on the hard mask insulation layer; performing selectively a photo-exposure process and a developing process to form a photoresist pattern having a first width for forming a line pattern; etching selectively the hard mask sacrificial layer by using the photoresist pattern as an etch mask to form a sacrificial hard mask having a second width; removing the photoresist pattern; etching the hard mask insulation layer by controlling excessive etching conditions with use of the sacrificial hard mask as an etch mask to form a hard mask having a third width; and etching the etch target layer by using the sacrificial hard mask and the hard mask as an etch mask to form the line pattern having a fourth width, wherein the first width is wider than the fourth width.

32 Claims, 7 Drawing Sheets

(Wd1>Wd2, D2>D1)

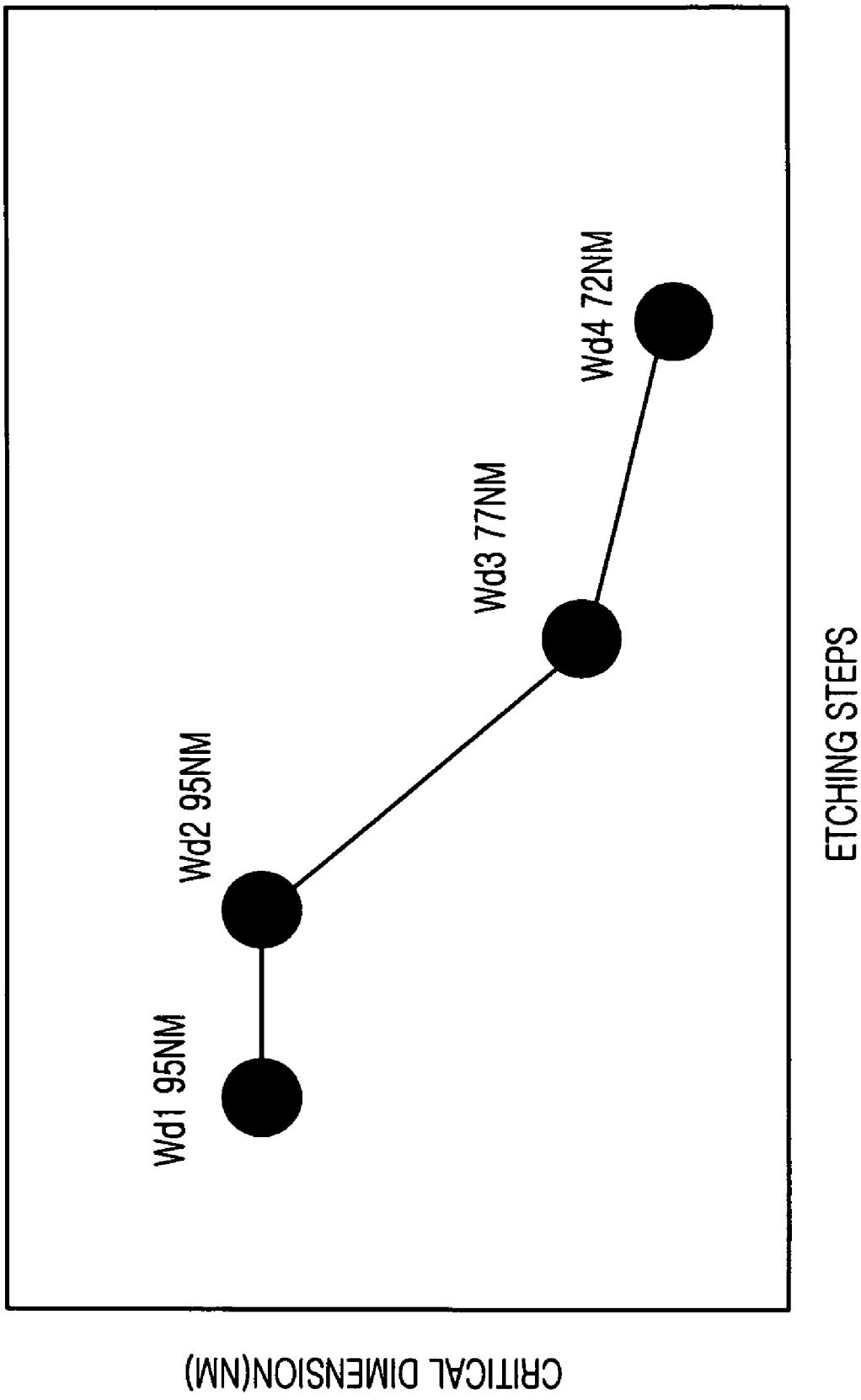

METHOD FOR FABRICATING SEMICONDUCTOR DEVICE WITH FINE PATTERNS

FIELD OF THE INVENTION

The present invention relates to a method for fabricating a semiconductor device; and, more particularly, to a method for fabricating a semiconductor device with fine patterns.

DESCRIPTION OF RELATED ARTS

Large scale of integration has led semiconductor unit devices, e.g., a transistor and a capacitor, to be formed densely within a predetermined cell area. Thus, the size of the unit devices has been gradually decreased as well. Particularly, in a semiconductor device like a dynamic random access memory (DRAM) device, the design rule has been also shifted toward a trend of minimization, further resulting in a decrease in the size of semiconductor devices. For instance, a currently fabricated semiconductor DRAM device has a minimum linewidth below about 0.1 μm, and thus, there arise many difficulties in forming semiconductor unit devices corresponding to this technical advance.

FIGS. 1A to 1F are perspective views illustrating a method for forming the line type storage nodes.

Referring to FIG. 1A, a conductive layer 11 for forming a bit line (hereinafter referred to as the bit line conductive layer) is formed on a substrate 10 providing various unit devices such as a transistor and a word line. An insulation layer 12 for a hard mask (hereinafter referred to as the hard mask insulation layer) is deposited on the bit line conductive layer 11. Then, a plurality of first photoresist patterns 13 for defining the width of the bit line is formed on the hard mask insulation layer 12.

Herein, the bit line conductive layer 11 is typically made of one selected among tungsten (W), tungsten silicide ($WSi_x$), titanium silicide ($TiSi_x$), cobalt silicide ($CoSi_x$), aluminum (Al) and copper (Cu). The hard mask insulation layer 12 serves to protect bit line patterns or gate electrode patterns in the course of forming contact holes by etching a typical inter-layer insulation layer 14. Thus, the hard mask insulation layer 12 is made of a material having a significantly different etching rate from that of the inter-layer insulation layer 14. For instance, if the inter-layer insulation layer 14 is made of an oxide-based material, silicon nitride or silicon oxynitride is used for the hard mask insulation layer 12. If the inter-layer insulation layer 14 is made of a polymer-based material having a lower dielectric constant, an oxide-based material is used for the hard mask insulation layer 12.

Referring to FIG. 1B, the hard mask insulation layer 12 is etched by using the first photoresist patterns 13 as an etch mask to form a plurality of hard masks 12A. Thereafter, the first photoresist patterns 13 are removed by a photoresist stripping process. The bit line conductive layer 11 is then etched by using the hard masks 12A as an etch mask so to form bit lines each having a stack structure of the hard mask 12A and the conductive pattern 11A. The photoresist stripping process can be performed after the bit line conductive layer 11 is etched.

Referring to FIG. 1C, an inter-layer insulation layer 14 made of an oxide-based material is formed on an entire surface of the resulting structure including the bit lines.

Next, as shown in FIG. 1D, a second photoresist pattern 15 for defining contact hole regions is formed on the inter-layer insulation layer 14. At this time, the second photoresist pattern 15 is formed by using a line type mask pattern.

Referring to FIG. 1E, the inter-layer insulation layer 14 is etched by using the photoresist pattern 15 as an etch mask to form contact holes 16 exposing a predetermined portion of the substrate 10 allocated between the conductive patterns 11A. Herein, the contact hole 16 is for a storage node contact. Also, since the conductive patterns 11A are bit lines, the exposed portion of the substrate 10 during the formation of the contact holes 16 corresponds to a plug conductive layer contacted to a source/drain junction region of the substrate 10. However, this plug conductive layer is not shown for the sake of simplified explanation.

Referring to FIG. 1F, a spacer 17 functioning as an etch stop layer is formed on sidewalls of each bit line. Hereinafter, the spacer 17 is referred to as the etch stop layer. The etch stop layer 17 is made of a typical nitride-based material since the etch stop layer 17 is for preventing losses of the hard masks 12A and the conductive patterns 11A during a subsequent etching process as like the function of the hard masks 12A.

For the process for forming line type contact holes as described above, the width Wd of the bit line and the thickness D of the hard mask 12A serve important functions. For instance, if the width Wd of the bit line is large, a gap-fill property may be degraded when the inter-layer insulation layer 14 is deposited and an aspect ratio may increases.

To solve the problems of the increase in the aspect ratio and the degradation of the gap-fill property, there is suggested a method of decreasing the width Wd of the bit line to improve the aspect ratio.

However, when the line type mask pattern, e.g., a self-aligned contact (SAC) mask pattern, is applied based on sub 0.1 μm integration technology, it is difficult to gap-fill the inter-layer insulation layer 14 between the bit lines without generating voids. Thus, it is required to reduce a critical dimension (CD) of the bit line to secure gap-fill margins by improving the aspect ratio.

Recently, this approach of decreasing the CD of the bit line has been focused greatly since the decreased CD of the bit line makes it possible to provide a solution to the gap-fill property degradation, increase an area of the bottom plug and form the etch stop layer for use in the spacer with a sufficient thickness. However, it is compulsory to develop appropriate photolithography for decreasing the CD of the bit line, and a photo-exposure process is one important process for achieving such effect.

Hence, such a laser as ArF having a wavelength of about 193 nm is used as a light source to attain the above described effects. However, it is not easy to secure the CD of about 0.1 μm in consideration of the fact that the minimum realizable width is about 0.08 μm even with use of the ArF. Also, the required width of the bit line is about 0.055 μm in order not to provoke the above mentioned problems, and thus, the advance in the development of the photolithography is not enough to achieve intended outcomes.

For this reason, there is currently suggested of a photoresist trimming technique for reducing the CD by inducing losses of the photoresist pattern with appropriate use of an etch gas after the formation of the photoresist pattern.

In other words, the photoresist trimming technique is an etching technique for obtaining a final inspection critical dimension (FICD) of the photoresist pattern narrower than an initially formed DICD of the photoresist pattern.

At this time, the photoresist trimming technique adopts the fact that the width of the photoresist pattern is decreased by performing a plasma etching due to characteristics of the material used for forming the photoresist. Typically, a plasma containing chlorine ($Cl_2$), hydrogen bromide (HBr) and oxygen ($O_2$) gas is used. More specifically, a predetermined portion of the photoresist pattern is etched by using a gas of $Cl_2/O_2$ or $HBr/O_2$, and then, a hard mask beneath the photoresist pattern is etched by using the etched photoresist pattern as an etch mask.

However, in case of employing an ArF photolithography technique applicable to sub 0.1 μm technology, an ArF photoresist is severely deformed when the ArF photoresist is etched by using the aforementioned $Cl_2/HBr/O_2$ plasma. Also, the photoresist trimming technique employing such ArF photolithography technique has several limitations in fabricating highly integrated semiconductor memory devices like DRAM.

SUMMARY OF THE INVENTION

It is, therefore, an object of the present invention to provide a method for fabricating a semiconductor device applicable with a photoresist trimming technique to form fine patterns.

It is another object of the present invention to provide a method for fabricating a semiconductor device capable of improving a gap-fill property when an insulation layer is deposited by narrowing a linewidth of a line pattern.

It is further another object of the present invention to provide a method for fabricating a semiconductor device through the use of ArF photolithography technique capable of minimizing the linewidth of the line pattern.

In accordance with an aspect of the present invention, there is provided a method for fabricating a semiconductor device, including the steps of: forming a hard mask insulation layer on an etch target layer; forming a hard mask sacrificial layer on the hard mask insulation layer; coating a photoresist on the hard mask insulation layer; selectively performing a photo-exposure process and a developing process to form a photoresist pattern having a first width for forming a line pattern; selectively etching the hard mask sacrificial layer by using the photoresist pattern as an etch mask to form a sacrificial hard mask having a second width; removing the photoresist pattern; etching the hard mask insulation layer by controlling excessive etching conditions with use of the sacrificial hard mask as an etch mask to form a hard mask having a third width; and etching the etch target layer by using the sacrificial hard mask and the hard mask as an etch mask to form the line pattern having a fourth width, wherein the first width is wider than the fourth width.

In accordance with another aspect of the present invention, there is also provided a method for fabricating a semiconductor device, including the steps of: forming a hard mask insulation layer on an etch target layer; forming a hard mask sacrificial layer on the hard mask insulation layer; forming an anti-reflective coating layer on the hard mask sacrificial layer; coating a photoresist on the anti-reflective coating layer; selectively performing a photo-exposure process and a developing process to form a photoresist pattern having a first width for forming a line pattern; etching the anti-reflective coating layer by using the photoresist pattern as an etch mask; selectively etching the hard mask sacrificial layer with use of the photoresist pattern as an etch mask to form a sacrificial hard mask having a second width; removing the photoresist pattern and the anti-reflective coating layer; etching the hard mask insulation layer by controlling excessive etching conditions with use of the sacrificial hard mask as an etch mask to form a hard mask having a third width; and etching the etch target layer by using the sacrificial hard mask and the hard mask as an etch mask to form the line pattern having a fourth width, wherein the first width is wider than the fourth width.

In accordance with still another aspect of the present invention, there is also provided a method for fabricating a semiconductor device, including the steps of: forming a conductive layer containing tungsten on a substrate; forming a hard mask insulation layer on the conductive layer; forming a hard mask sacrificial layer containing tungsten on the hard mask insulation layer; forming a photoresist pattern having a first width on the hard mask sacrificial layer; etching selectively the hard mask sacrificial layer with use of the photoresist pattern as an etch mask to form a sacrificial hard mask having a second with; removing the photoresist pattern; etching the hard mask insulation layer with use of the sacrificial hard mask as an etch mask by controlling excessive etching conditions to thereby form a hard mask having a third width; and etching the conductive layer by using the sacrificial hard mask and the hard mask as an etch mask to form the line type conductive pattern having a fourth width, wherein the first width is wider than the fourth width.

BRIEF DESCRIPTION OF THE DRAWING(S)

The above and other objects and features of the present invention will become apparent from the following description of the preferred embodiments given in conjunction with the accompanying drawings, in which:

FIG. 3 is a graph showing changes in a critical dimension (CD) in each step illustrated in FIGS. 2A to 2D.

DETAILED DESCRIPTION OF THE INVENTION

In order to minimize a linewidth of a line type conductive pattern, e.g., a bit line, etch gases and other process conditions are controlled in the course of etching an upper sacrificial hard mask containing tungsten and a nitride-based bottom hard mask. Therefore, it is possible to form fine patterns without being impacted by $F_2$ or ArF photolithography causing severe pattern deformation.

Hereinafter, a preferred embodiment of the present invention will be described in more detail with reference to the accompanying drawings.

FIGS. 2A to 2D are cross-sectional views illustrating serial processes for forming line type patterns of a semiconductor device by using a light source of $F_2$ or ArF in accordance with a preferred embodiment of the present invention.

Figure 1A:
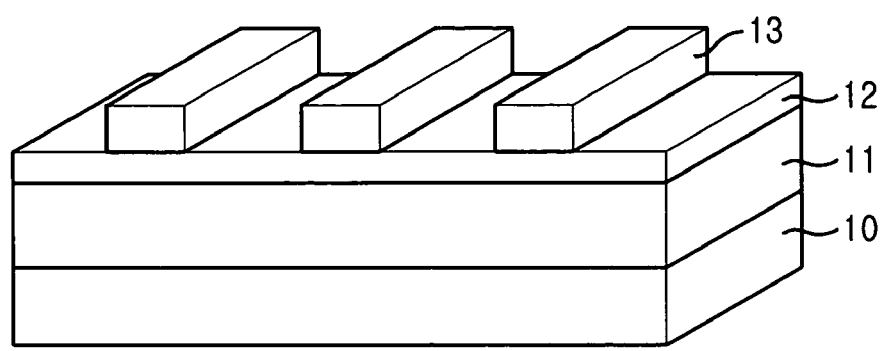
FIGS. 1A to 1F are cross-sectional views illustrating serial processes for forming line type storage nodes.
Figure 1B:
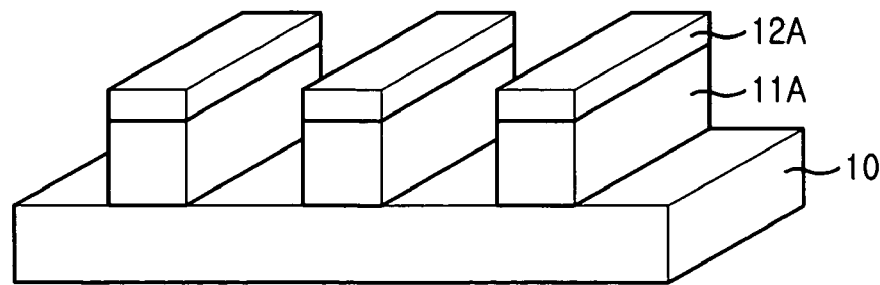
Figure 1C:
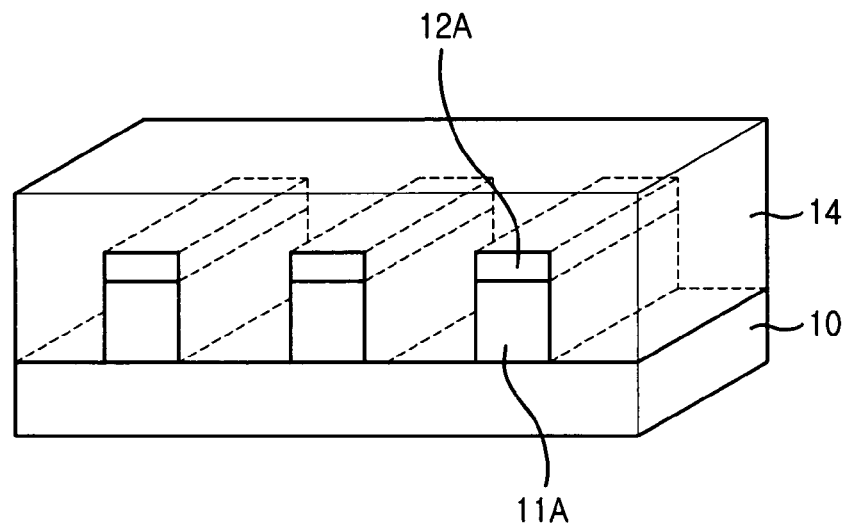
Figure 1D:
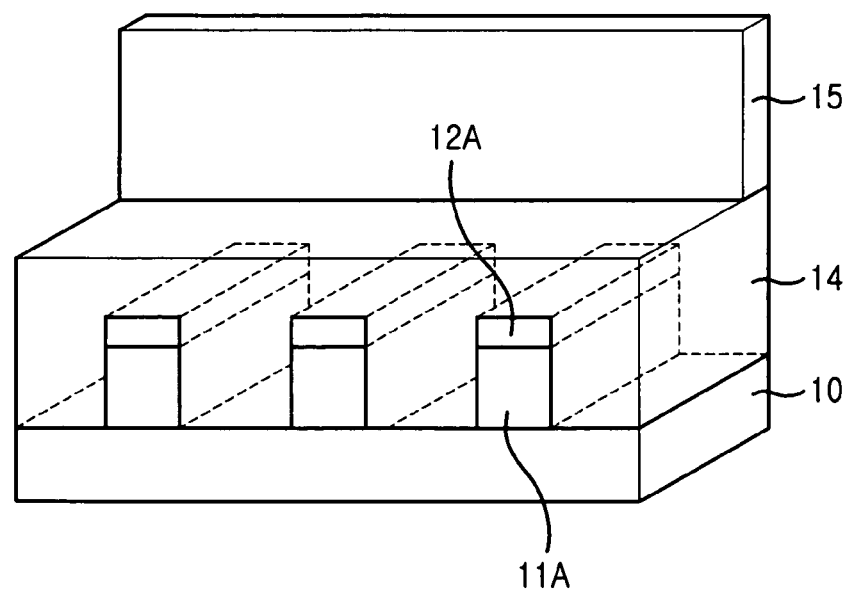
Figure 1E:
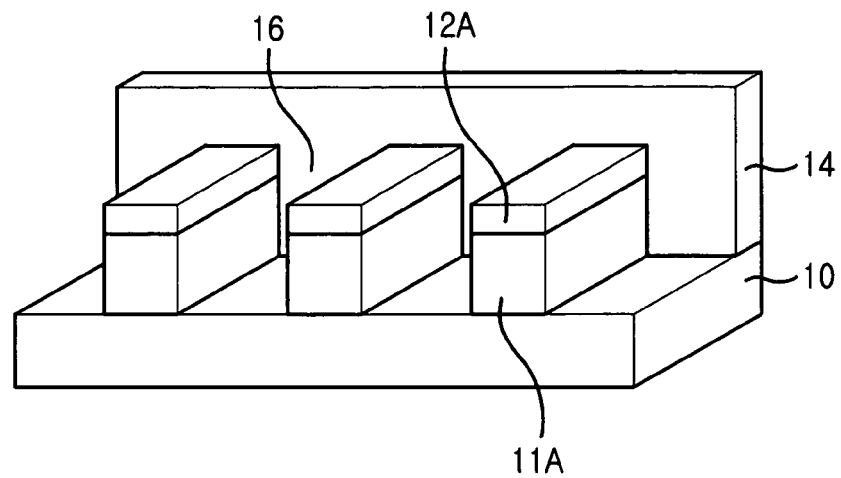
Figure 1F:
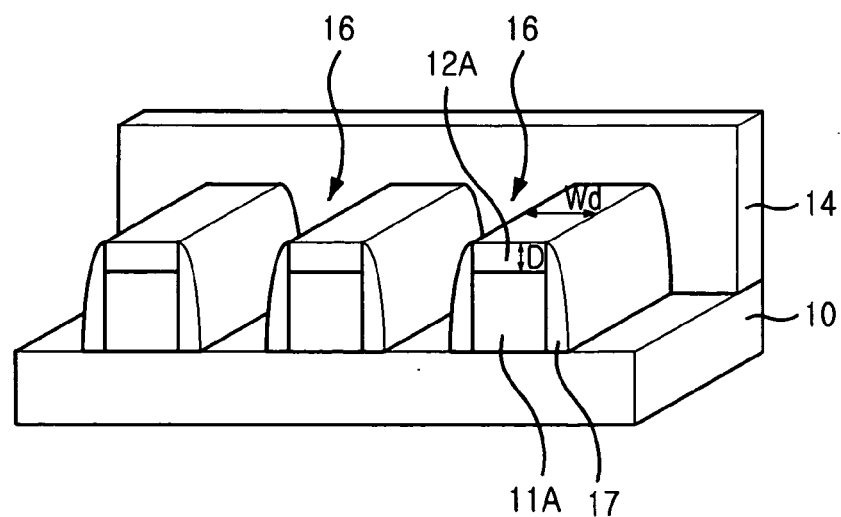
Figure 2A:
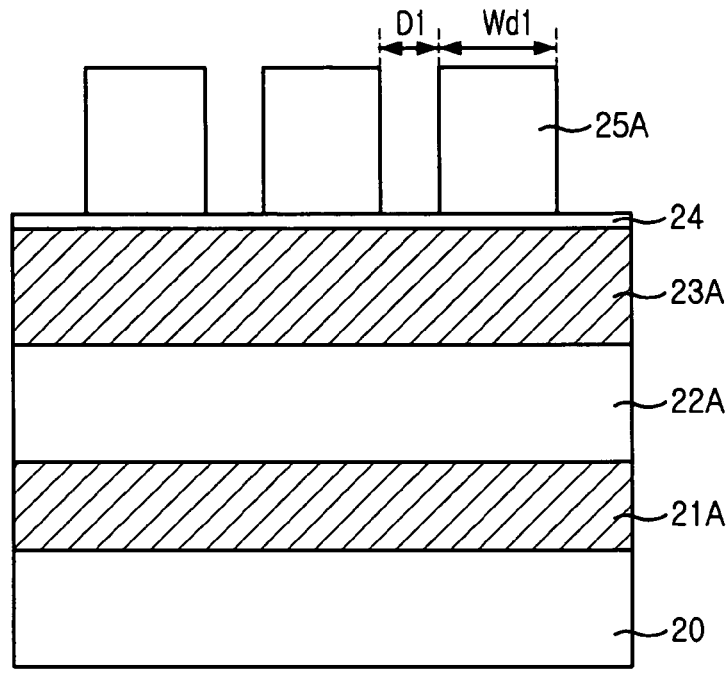
FIGS. 2A to 2D are cross-sectional views illustrating serial processes for forming line patterns of a semiconductor device by using a light source of $F_2$ or ArF in accordance with a preferred embodiment of the present invention.

Referring to FIG. 2A, a conductive layer 21A, which is an etch target layer, is formed on a substrate 20 providing unit devices such as a transistor and a word line. Then, an insulation layer 22A for use in a hard mask (hereinafter referred to as the hard mask insulation layer) is deposited on the conductive layer 21A. Herein, the hard mask insulation layer 22A is made of a nitride-based material such as $Si_3N_4$ having insulating characteristics and specific selectivity with respect to the etch target layer, i.e., the conductive layer 21A or a thin layer made of an oxide-based material such as silicon oxide ($SiO_2$) or aluminum oxide ($Al_2O_3$). Also, the hard mask insulation layer 22A can be made of an oxynitride material such as silicon oxynitride (SiON).

Subsequent to the deposition of the hard mask insulation layer 22A, a sacrificial layer 23A for use in a hard mask (hereinafter referred to as the hard mask sacrificial layer) is formed on the hard mask insulation layer 22A in order to prevent pattern deformation caused by losses of the hard mask insulation layer 22A. Herein, the hard mask sacrificial layer 23A is made of a material selected from a group consisting of polysilicon, Al, W, $WSi_x$, WN, Ti, TiN, $TiSi_x$, TiAlN, TiSiN, Pt, Ir, $IrO_2$, Ru, $RuO_2$, Ag, Au, Co, TaN, CrN, CoN, MoN, $MoSi_x$, $Al_2O_3$, AlN, $PtSi_x$ and $CrSi_x$. Also, all subscripts x representing atomic ratios range from about 1 to about 2. Also, at this time, the hard mask sacrificial layer 23A is deposited to a thickness allowing an easy removal of the hard mask sacrificial layer 23A when the conductive layer 21A is etched. Preferably, the thickness of the hard mask sacrificial layer 23A ranges from about 500 Å to about 3000 Å. The hard mask insulation layer 22A has a thickness preferably ranging from about 500 Å to about 5000 Å.

In addition, it is preferred that the conductive layer 21A is made of the same material with the hard mask sacrificial layer 23A, i.e., the W contained material, in order not to perform an additional process for removing the hard mask sacrificial layer 23A. However, it is still possible to omit the process for removing the hard mask sacrificial layer 23A even without using the same material by controlling the thickness and etching conditions according to etch selectivity values of each material.

More specifically, the conductive layer 21A is made of a material selected from a group consisting of W, $WSi_x$, $TiSi_x$, $CoSi_x$, Al and Cu. The hard mask insulation layer 22A is for protecting bit line patterns or gate electrode patterns in the course of forming contact holes by etching a typical inter-layer insulation layer, and thus, the hard mask insulation layer 22A is made of a material having significantly different etching rate with the inter-layer insulation layer. For instance, if the inter-layer insulation layer is made of an oxide-based material, the hard mask insulation layer 22A is made of a nitride-based material such as $Si_3N_4$ or SiON. If a polymer-based material having a low dielectric constant is used for the inter-layer insulation layer, the hard mask insulation layer 22A is made of an oxide-based material.

Furthermore, the substrate 20 includes insulating structures and conductive structures. Particularly, if the conductive layer 21A is used for bit line patterns or metal lines as shown in the preferred embodiment of the present invention, there is formed a plug comprising at least one of a diffusion barrier layer made of Ti and TiN, an impurity junction region such as a source/drain, an inter-layer insulation layer, a polysilicon layer and a W layer on an interface between the conductive layer 21A and the substrate 20. If the conductive layer 21A is for forming gate electrode patterns, a gate insulation layer (not shown) is formed on an interface between the conductive layer 21A and the substrate 20.

An anti-reflective coating (ARC) layer 24 is formed on the hard mask sacrificial layer 23A to prevent formation of undesired patterns caused by scattered reflection created by high reflectance of the hard mask sacrificial layer 23A during a photo-exposure process for forming patterns on the hard mask sacrificial layer 23 and to improve adhesion between the hard mask sacrificial layer 23A and a photoresist which will be subsequently coated.

Herein, the ARC layer 24 is formed with an organic material having similar etching characteristics with the photoresist. Thus, it is preferable to form the ARC layer 24 with a thickness ranging from about 100 Å to about 1000 Å.

After the deposition of the ARC layer 24, a photoresist made of cyclic olefin maleic anhydride (COMA) or acrylate is coated on the ARC layer 24 by performing a spin coating technique. Herein, the photoresist is for use in $F_2$ or ArF photolithography. A predetermined portion of the photoresist is then selectively photo-exposed by using a light source of $F_2$ or ArF and a predetermined reticle (not shown) for defining the width of a bit line. Thereafter, a developing process makes photo-exposed portions and non-exposed portions remain, and a cleaning process is performed to remove etch remnants to thereby form a plurality of first photoresist pattern 25A.

The denotations Wd1 and D1 express the width of the first photoresist pattern 25A and a spacing distance between the first photoresist patterns 25A. Thus, the width Wd1 is a develop inspection critical dimension (DICD) of a bit line to be subsequently formed. Also, the Wd1 and the D1 are referred to as the first width and the first spacing distance hereinafter.

Figure 2B:
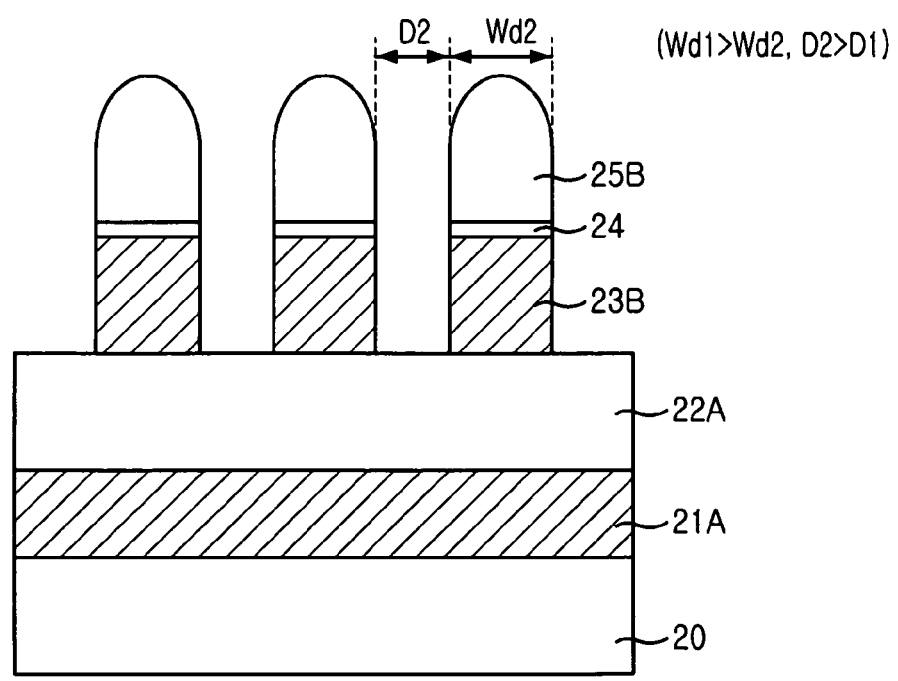

Referring to FIG. 2B, the ARC layer 24 is selectively etched by performing an etching process with use of the first photoresist patterns 25A as an etch mask. At this time, a chlorine-based plasma such as $Cl_2$, $BCl_3$, $CCl_4$ and HCl is used as an etch gas to attain a trimming effect by minimizing deformation of the first photoresist patterns 25A. It is also preferable to add $O_2$ gas to this etch gas.

In case of using a reactive ion etching (RIE) equipment, top and bottom portions of a reaction chamber are supplied with different powers ranging from about 400 Watt to about 800 Watt and from about 70 Watt to about 130 Watt, respectively, and a pressure within the reaction chamber is maintained in a range from about 6 mTorr to about 12 mTorr. Also, when a mixed gas of $Cl_2$ and Ar is used, it is preferable to use the $Cl_2$ and Ar each with a quantity ranging from about 35 sccm to about 65 sccm and from about 20 sccm to about 50 sccm, respectively.

Next, the hard mask sacrificial layer 23A is etched by using the first photoresist patterns 25A and the ARC layer 24 as an etch mask to form a plurality of sacrificial hard masks 23B. If the hard mask sacrificial layer 23A is a tungsten (W) containing thin layer such like a tungsten (W) layer, tungsten silicide ($WSi_x$) layer and a tungsten nitride (WN) layer, a plasma using a mixed gas of $SF_6$ and $N_2$ is used.

At this time, in case of using the RIE equipment, top and bottom portions of the reaction chamber are supplied with different powers ranging from about 450 Watt and about 850 Watt and from about 30 Watt to about 60 Watt, respectively, and a pressure within the reaction chamber is maintained in a range from about 8 mTorr to about 16 mTorr. Also, it is preferable to use the $SF_6$ and $N_2$ each with a quantity ranging from about 7 sccm to about 13 sccm and from about 10 sccm to about 20 sccm, respectively.

Also, if the hard mask sacrificial layer 23A is a Ti containing thin layer such like a Ti layer, a TiN layer, a TiSix layer, a TiAlN layer and a TiSiN layer, a chlorine-based gas, particularly $Cl_2$ gas, is used as a main etch gas. At this time, $O_2$ or CF gas is added to the main etch gas to control an etch profile.

In case that the hard mask sacrificial layer 23A is a thin layer made of Pt, Ir, Ru or an oxide material of the above listed noble metals, a plasma containing chlorine-based gas or fluorine-based gas is used. At this time, it is necessary to use high ion energy to control the etch profile, and thus, a condition of a low pressure and a high bias power is preferably maintained.

As shown in FIG. 2B, after the above etching process, each of the remaining photoresist patterns 25B has a second width Wd2 narrower than the first width Wd1 of the first photoresist pattern 25A due to the trimming effect. Hereinafter, the remaining photoresist pattern 25B is referred to as the second photoresist pattern. Conversely, a second spacing distance D2 between the second photoresist patterns 25B become wider than the first spacing distance D1 between the first photoresist patterns 25A.

Although a change in the width of each bit line in FIG. 2B is not shown in a great extent, it is possible to obtain a final inspection critical dimension (FICD) of the bit line decreased by about 20 nm with respect to the DICD.

Subsequently, a photoresist stripping process is performed to remove the second photoresist patterns 25B and the ARC layer 24, and a cleaning process is then performed to remove etch remnants having polymer characteristics.

Figure 2C:
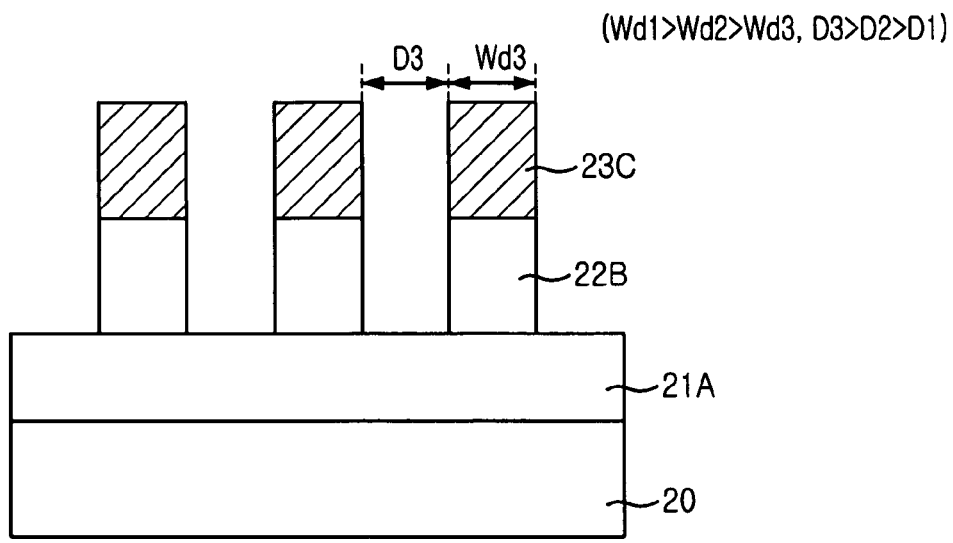

Referring to FIG. 2C, the hard mask insulation layer 22A is etched by using the sacrificial hard masks 23B as an etch mask so to form hard masks 22B.

In case that the hard mask insulation layer 22A is a nitride-based layer, a plasma containing a mixed gas of tetrafluoride ($CF_4$), trifluoromethane ($CHF_3$), ethylene ($C_2H_4$), helium (He), argon (Ar) and oxygen ($O_2$) gas is used. At this time, if the RIE equipment is used, a power in a range from about 400 Watt to about 800 Watt is supplied and a pressure within the reaction chamber is maintained in a range from about 35 mTorr to about 65 mTorr. Also, it is preferable to use the $CF_4$, $CHF_3$, Ar and $O_2$ gas each with a quantity ranging from about 25 ccm to about 65 sccm, from about 40 sccm to about 80 sccm, from about 50 sccm to about 100 sccm and from about 12 sccm to about 25 sccm, respectively.

As shown in FIG. 2C, the second width Wd2 of each sacrificial hard mask 23B is trimmed to a third width Wd3, which will be the width of each bit line region. Hereinafter, the remaining sacrificial hard mask having the third width Wd3 is denoted as 23C. On contrary to the narrowed width, a third spacing distance D3 between the remaining sacrificial hard masks 23C is wider than the second spacing distance D2 between the sacrificial hard masks 23B.

In addition, a quantity of the $O_2$ gas used in etching the hard masks 22B and an over-etching time are controlled to control an extent of trimming each of the sacrificial hard masks 23C so that the final bit line have the FICD reduced by more than 20 nm from the DICD.

Furthermore, it is possible to prevent pattern deformation caused by an excessive etching of the first photoresist patterns 25B or the ARC layer 24 that is mandated to be used as an etch mask during the etching of the hard mask insulation layer 22A in case that the sacrificial hard masks 23B are not used as the etch mask.

Figure 2D:
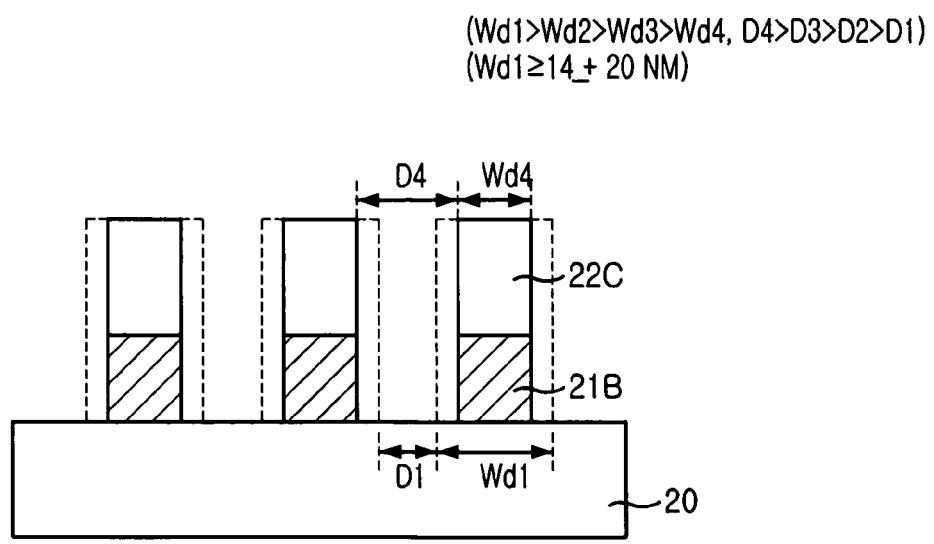

Referring to FIG. 2D, the conductive layer 21A is selectively etched by using the remaining sacrificial hard masks 23C and the hard masks 22B as an etch mask to form a plurality of the bit lines each having a stack structure of the remaining hard mask 22C and the conductive pattern 21B.

At this time, the conductive layer 21A is made of the same material with the hard mask sacrificial layer 23A in order to eliminate additional etching process for removing the remaining sacrificial hard masks 23C used as the etch mask. Even if the conductive layer 21A is made of a different material from the hard mask sacrificial layer 23A, it is still possible to omit the additional etching process for removing the remaining sacrificial hard masks 23C by controlling a thickness of the conductive layer 21A and the etching conditions, which cause the remaining sacrificial hard masks 23C to be removed during the etching of the conductive layer 21A. Also, it is possible to prevent losses of the hard masks 22B caused by the remaining sacrificial hard masks 23C, and thereby being able to prevent deformation of the conductive patterns 21B.

Herein, the etching conditions for the conductive layer 21A is same as those applied to the formation of the sacrificial hard masks 23B except for the quantity and etching time.

That is, in case of using the RIE equipment, top and bottom portions of the reaction chamber is supplied with different powers ranging from about 450 Watt to about 850 Watt and from about 30 Watt to about 60 Watt, respectively. Also, a pressure within the reaction chamber is maintained in the same range of about 8 mTorr to about 16 mTorr. Additionally, it is preferable to use $SF_6$ and $N_2$ each with a quantity ranging from about 7 sccm to about 13 sccm and from about 10 sccm to about 20 sccm, respectively.

In FIG. 2D, the remaining hard mask 22C has a fourth width Wd4 trimmed from the third width Wd3 of the hard mask 22B. On the other hand, a fourth spacing distance D4 between the remaining hard masks 22C becomes wider than the third spacing distance D3 between the hard masks 22B. Herein, the decreased fourth width Wd4 is the FICD of the final bit line.

As described above, the diffusion barrier layer including the Ti layer and the TiN layer is formed on the interface between the conductive pattern 21B and the substrate 20. Thus, when the diffusion barrier layer is etched, a plasma containing a mixed gas of $BCl_3$ and $Cl_2$ is used.

At this time, in case of using the RIE equipment, top and bottom portions of the reaction chamber is supplied with different powers ranging from about 400 Watt to about 550 Watt and from about 50 Watt to about 100 Watt, respectively, and a pressure within the reaction chamber is maintained in a range from about 7 mTorr to about 13 mTorr. Also, it is preferable to use the $BCl_3$ and $N_2$ each with a quantity ranging from about 7 sccm to about 13 sccm and from about 80 sccm to about 150 sccm, respectively.

FIG. 3 is a graph showing changes in a critical dimension in each step illustrated from FIGS. 2A to 2D.

As shown, at the first step, the DICD, i.e., the first width Wd1, is about 95 nm, and this first width Wd1 changes to the second width Wd2 of about 92 nm after the sacrificial hard mask 23B formation. Thus, the trimming effect attained from the sacrificial hard mask 23B formation results in a decrease of the CD by about 2 nm. Thereafter, the second width Wd2 of the sacrificial hard mask 23B changes to the third width Wd3 of about 77 nm. During the hard mask 22B formation, the trimming effect results in a decrease of the CD by about 15 nm. Also, during the conductive pattern 21B formation, the fourth width Wd4 of the final bit line, i.e., the FICD, is about 72 nm reached by the trimming effect. That is, the third width Wd3 decreases by about 5 nm. In overall, the DICD decreases by more than about 20 nm providing the reduced FICD of the final bit line.

Accordingly, in case of forming the bit lines through ArF lithography, it is possible to minimize the pattern deformation by using the sacrificial hard mask. Also, the final width, i.e., the FICD, of the bit line can be reduced by at least about 20 nm compared to the first width Wd1, i.e., the DICD of the bit line, by controlling use of the etch gas and targeted etch time.

Figure 4:
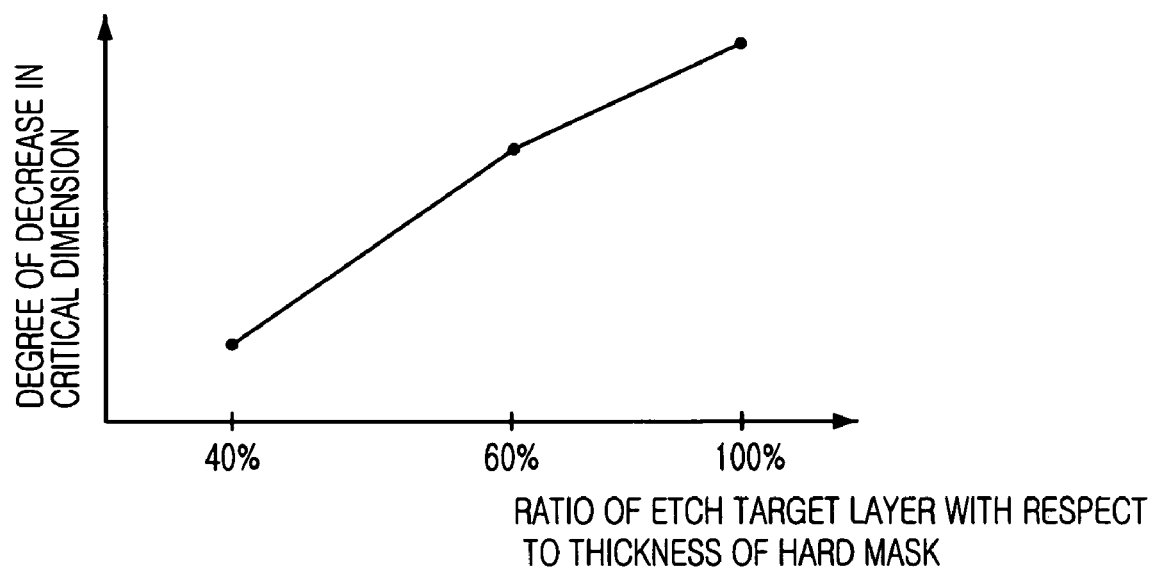
FIG. 4 is a graph showing a relationship between varying CDs of an etch target layer and a ratio of the excessively etched target layer with respect to the thickness of a hard mask.

FIG. 4 is a graph showing a relationship between varying CDs of an etch target and a ratio of the excessively etched target with respect to the thickness of the hard mask.

As shown, the trimming is accelerated in proportion to the etching time. Each of marked points at about 40%, about 60% and about 100% represents a period of performing additionally the excessive etching process around an end of point (EPO) for etching the hard mask insulation layer 22A. Therefore, it is preferable to control the excessive etching time based on the thickness and material characteristics of the hard mask insulation layer 22A, which eventually becomes the hard mask 22B.

The line type conductive patterns fabricated according to the preferred embodiment of the present invention have the stack structure of the nitride-based hard mask and the sacrificial hard mask, which is the tungsten containing metal conductive layer. Compared to the conventional $F_2$ or ArF photolithography, appropriate control of the trimming achieved by correspondingly manipulating the etch gas and the excessive etching time provides advantages of preventing the pattern deformation and realizing advanced fine patterns. As a result of these advantages, it is further possible to achieve an increase in yield of semiconductor devices and cost-effective fabrication.

Although the preferred embodiment of the present invention exemplifies a process for forming the conductive patterns, particularly, the bit lines, it is still possible to apply the present invention to formation of other the conductive patterns such as gate electrode patterns, storage node contacts and metal lines.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising:
   forming a hard mask insulation layer on an etch target layer;
   forming a hard mask sacrificial layer on the hard mask insulation layer;
   coating a photoresist on the hard mask insulation layer;
   selectively performing a photo-exposure process and a developing process to form a photoresist pattern having a first width for forming a line pattern;
   selectively etching the hard mask sacrificial layer by using the photoresist pattern as an etch mask to form a sacrificial hard mask having a second width;
   removing the photoresist pattern;
   etching the hard mask insulation layer by controlling excessive etching conditions with use of the sacrificial hard mask as an etch mask to form a hard mask having a third width; and
   etching the etch target layer by using the sacrificial hard mask and the hard mask as an etch mask to form the line pattern having a fourth width,
   wherein magnitudes of the first width to the fourth width are in a descending order of the first width, the second width, the third width and the fourth width.

2. The method as recited in claim 1, wherein the etch target layer is a conductive layer and the line pattern is one of a bit line, a word line and a metal line.

3. The method as recited in claim 1, wherein the photoresist is one of a photoresist for use in ArF photolithography and a photoresist for use in $F_2$ photolithography.

4. The method as recited in claim 1, wherein the first width is wider than the fourth width by about at least 20 nm.

5. The method as recited in claim 1, wherein the sacrificial hard mask is removed at the step of removing the etch target layer.

6. The method as recited in claim 1, wherein the hard mask sacrificial layer is made of a material selected from a group consisting of polysilicon, aluminum (Al), tungsten (W), tungsten silicide ($WSi_x$), where x ranges from about 1 to about 2, tungsten nitride (WN), titanium (Ti), titanium nitride (TiN), titanium silicide ($Tisi_x$), where x ranges from about 1 to 2, titanium aluminum nitride (TiAlN), titanium silicide nitride (TiSiN), platinum (Pt), iridium (Ir), iridium oxide ($IrO_2$), ruthenium (Ru), ruthenium oxide ($RuO_2$), silver (Ag), cobalt (Co), gold (Au), tantalum nitride (TaN), chromium nitride (CrN), cobalt nitride (CoN), molybdenum nitride (MoN), molybdenum silicide ($MoSi_x$), where x ranges from about 1 to about 2, aluminum oxide ($Al_2O_3$), aluminum nitride (AlN), Platinum silicide ($PtSi_x$), where x ranges from about 1 to about 2 and chromium silicide ($CrSi_x$), where x ranges from about 1 to 2.

7. The method as recited in claim 6, wherein the etch target layer is made of the same material used for the hard mask sacrificial layer.

8. The method as recited in claim 1, wherein the hard mask sacrificial layer is made of one of an oxide-based material, a nitride-based material and an oxynitride based material.

9. The method as recited in claim 2, wherein the etch target layer is preferably made of tungsten.

10. The method as recited in claim 6, wherein at the step of etching, the hard mask sacrificial layer, a plasma containing a mixed gas of sulfur hexafluoride ($SF_6$) and nitrogen ($N_2$) is used when the hard mask sacrificial layer is made of tungsten.

11. The method as recited in claim 10, wherein at the step of etching the hard mask sacrificial layer made of tungsten, bottom and top portions of a reaction chamber of a reactive ion etching (RIE) equipment are supplied with different powers ranging from about 450 Watt to about 850 Watt and from about 30 Watt to about 60 Watt, respectively along with a chamber pressure maintained in a range from about 8 mTorr to about 16 mTorr and a mixed gas of $SF_6$ and $N_2$ each with a quantity in a range from about 7 sccm to about 13 sccm and from about 10 sccm to about 20 sccm, respectively.

12. The method as recited in claim 6, wherein at the step of etching the hard mask sacrificial layer, a chlorine-based gas is used as a main etch gas when the hard mask sacrificial layer is formed with one material of polysilicon and Ti and one of oxygen ($O_2$) gas and carbon fluoride (CF) gas is added to the main etch gas to control an etch profile.

13. The method as recited in claim 6, wherein at the step of etching the hard mask sacrificial layer, one of a chlorine-based plasma and a fluorine-based plasma is used when the hard mask sacrificial layer is made of a material selected from a group consisting of Pt, Ir, Ru and any one oxide of these listed metals.

14. The method as recited in claim 8, wherein at the step of etching the hard mask insulation layer, a plasma containing a mixed gas of carbon tetrafluoride (CF4), trifluoro methane ($CHF_3$), ethylene ($C_2H_4$), helium (He), argon (Ar) and oxygen ($O_2$) is used when the hard mask insulation layer is made of a nitride-based material.

15. The method as recited in claim 13, wherein at the step of etching the nitride-based hard mask insulation layer, a RIE equipment is used by supplying a power in a range from about 400 Watt to about 800 Watt along with a pressure maintained in a range from about 35 mTorr to about 65 mTorr and a mixed gas of $CF_4$, $CHF_3$, Ar and $O_2$ each with a quantity in a range from about 25 sccm to about 65 sccm, from about 40 sccm to about 80 sccm, from about 50 sccm to about 100 sccm and from about 12 sccm to about 25 sccm, respectively.

16. The method as recited in claim 1, wherein the step of etching the etch target layer proceeds by using a plasma containing a mixed gas of $SF_6$ and $N_2$.

17. A method for fabricating a semiconductor device, comprising:
    forming a hard mask insulation layer on an etch target layer;
    forming a hard mask sacrificial layer on the hard mask insulation layer;
    forming an anti-reflective coating layer on the hard mask sacrificial layer;
    coating a photoresist on the anti-reflective coating layer;
    selectively performing a photo-exposure process and a developing process to form a photoresist pattern having a first width for forming a line pattern;
    etching the anti-reflective coating layer by using the photoresist pattern as an etch mask;
    selectively etching the hard mask sacrificial layer with use of the photoresist pattern as an etch mask to form a sacrificial hard mask having a second width;
    removing the photoresist pattern and the anti-reflective coating layer;
    etching the hard mask insulation layer by controlling excessive etching conditions with use of the sacrificial hard mask as an etch mask to form a hard mask having a third width; and
    etching the etch target layer by using the sacrificial hard mask and the hard mask as an etch mask to form the line pattern having a fourth width,
    wherein magnitudes of the first width to the fourth width are in a descending order of the first width, the second width, the third width and the fourth width.

18. The method as recited in claim 17, wherein the photoresist is one of a photoresist for use in ArF photolithography and a photoresist for use in $F_2$ photolithography.

19. The method as recited in claim 17, wherein the first width is wider than the fourth width by at least about 20 nm.

20. The method as recited in claim 17, wherein the hard mask sacrificial layer is made of a material selected from a group consisting of polysilicon, Al, W, $WSi_x$, where x ranges from about 1 to about 2, WN, Ti, TiN, $Tisi_x$, where x ranges from about 1 to 2, TiAlN, TiSiN, Pt, Ir, $IrO_2$, Ru, $RuO_2$, Ag, Co, Au, TaN, CrN, CoN, MoN, $MoSi_x$, where x ranges from about 1 to about 2, $Al_2O_3$, AlN, $PtSi_x$, where x ranges from about 1 to about 2 and $CrSi_x$, where x ranges from about 1 to 2.

21. The method as recited in claim 17, wherein the anti-reflective coating layer is made of an organic material.

22. The method as recited in claim 17, wherein the step of etching the anti-reflective coating layer proceeds by using a plasma containing a mixed gas of $Cl_2$ and Ar.

23. The method as recited in claim 22, wherein at the step of etching the anti-reflective coating layer, bottom and top portions of a reaction chamber of a RIE equipment are supplied with different powers ranging from about 400 Watt to about 800 Watt and from about 70 Watt to about 130 Watt, respectively along with a chamber pressure maintained in a range from about 6 mTorr to about 12 mTorr and a mixed gas of $Cl_2$ and Ar each with a quantity in a range from about 35 sccm to about 65 sccm and from about 20 sccm to about 50 sccm, respectively.

24. A method for fabricating a semiconductor device, comprising:
    forming a conductive layer containing tungsten on a substrate;
    forming a hard mask insulation layer on the conductive layer;
    forming a hard mask sacrificial layer containing tungsten on the hard mask insulation layer;
    forming a photoresist pattern having a first width on the hard mask sacrificial layer;
    selectively etching the hard mask sacrificial layer with use of the photoresist pattern as an etch mask to form a sacrificial hard mask having a second with;
    removing the photoresist pattern;
    etching the hard mask insulation layer with use of the sacrificial hard mask as an etch mask by controlling excessive etching conditions to thereby form a hard mask having a third width; and
    etching the conductive layer by using the sacrificial hard mask and the hard mask as an etch mask to form the line type conductive pattern having a fourth width,
    wherein magnitudes of the first width to the fourth width are in a descending order of the first width, the second width, the third width and the fourth width.

25. The method as recited in claim 24, wherein the photoresist pattern is one of a photoresist for use in ArF photolithography or a photoresist for use in $F_2$ photolithography.

26. The method as recited in claim 24, wherein the conductive pattern is one of a bit line, a word line and a metal line.

27. The method as recited in claim 24, wherein the sacrificial hard mask is removed at the step of etching the conductive layer.

28. The method as recited in claim 24, wherein the conductive layer is made of the same material with the hard mask sacrificial layer.

29. The method as recited in claim 24, wherein the conductive layer and the hard mask sacrificial layer both containing tungsten include any one of a W layer, a $WSi_x$ layer and WN layer.

30. The method as recited in claim 24, wherein the hard mask insulation layer is formed with one of an oxide-based material, a nitride-based material and an oxynitride-based material.

31. The method as recited in claim 24, wherein an anti-reflective coating layer is formed on between the photoresist pattern and the hard mask sacrificial layer.

32. The method as recited in claim 24, wherein the step of etching the hard mask sacrificial layer proceeds at a RIE equipment by using a plasma containing a mixed gas of $SF_6$ and $N_2$ and top and bottom portions of a reaction chamber of the RIE equipment are supplied with different powers ranging from about 450 Watt to about 850 Watt and from about 30 Watt to about 60 Watt, respectively along with a pressure maintained in a range from about 8 mTorr to about 16 mTorr, $SF_6$ with a quantity ranging from about 7 sccm to about 13 sccm and $N_2$ with a quantity ranging from about 10 sccm to about 20 sccm.

* * * * *